(12) United States Patent
Ho et al.

(10) Patent No.: US 7,547,224 B2
(45) Date of Patent: Jun. 16, 2009

(54) CHIP HOLDING APPARATUS

(75) Inventors: Hsien-Tsung Ho, Taipei (TW); Yung-Tang Lee, Taipei (TW)

(73) Assignee: Inventec Appliances Corp., Taipei (TW)

( * ) Notice: Subject to any disclaimer, the term of this patent is extended or adjusted under 35 U.S.C. 154(b) by 0 days.

(21) Appl. No.: 12/081,826

(22) Filed: Apr. 22, 2008

(65) Prior Publication Data

US 2008/0280498 A1 Nov. 13, 2008

(30) Foreign Application Priority Data

May 8, 2007 (TW) .............................. 96116318 A

(51) Int. Cl.
*H01R 13/62* (2006.01)
(52) U.S. Cl. ..................................... 439/331
(58) Field of Classification Search .................. 439/330, 439/331

See application file for complete search history.

(56) References Cited

U.S. PATENT DOCUMENTS

| | | | | |
|---|---|---|---|---|
| 5,320,550 A | * | 6/1994 | Uratsuji et al. | 439/266 |
| 5,742,487 A | * | 4/1998 | Kobayashi et al. | 361/809 |
| 6,368,137 B1 | * | 4/2002 | Orwoll | 439/331 |
| 6,651,817 B2 | * | 11/2003 | Shim et al. | 206/726 |
| 7,156,680 B2 | * | 1/2007 | Saito | 439/331 |
| 7,204,708 B2 | * | 4/2007 | Sato et al. | 439/259 |
| 7,232,328 B2 | * | 6/2007 | Saito | 439/331 |
| 7,371,078 B2 | * | 5/2008 | Ito et al. | 439/73 |
| 7,393,232 B2 | * | 7/2008 | Morinari | 439/331 |
| 2006/0270265 A1 | * | 11/2006 | Saito | 439/331 |
| 2007/0020983 A1 | * | 1/2007 | Yang et al. | 439/331 |

* cited by examiner

*Primary Examiner*—Ross N Gushi
(74) *Attorney, Agent, or Firm*—Birch, Stewart, Kolasch & Birch, LLP

(57) ABSTRACT

A chip holding apparatus includes a holding block disposed above a circuit board that is formed with a plurality of sockets for holding chips respectively. Each of the sockets is formed with a retainer for securely holding the chip. The chip holding apparatus further includes a lift assembly coupled operably to the holding block. The holding block is formed with a plurality of openings. The lift assembly moves the holding block to a lower position, in which, the holding block presses and disengages the retainers from the sockets in order to permit insertion of the plurality of chips into the sockets via the openings in the holding block, and an upper position above the lower position, in which, the retainers retrieve to its normal condition, thereby retaining the chips securely within the sockets, respectively.

9 Claims, 5 Drawing Sheets

CHIP HOLDING APPARATUS

FIELD OF THE INVENTION

The invention relates to a chip holding apparatus, more particularly to a chip holding apparatus that is capable of simultaneously disengaging a plurality of retainers from the sockets formed on a circuit board so as to permit insertion of a plurality of chips into the sockets respectively.

BACKGROUND OF THE INVENTION

The application of mobile phones increases as the technology advances further. Today, a mobile phone becomes an indispensable communication device in our daily life. The GPS (Global Positioning System) technology is applied in driving vehicles, touring and sport activities in order to locate the desired destination in addition to its commercial and military uses.

Nowadays, the GPS receiver is usually coupled to a portable hand-held device, such as a mobile phone, a PDA (Personal Digital Assistant) or a navigation device in order to assist the user to obtain the surrounding maps for locating a desired position and other information, thereby economizing the time for reaching the desired destination.

Since the hand-held device, for coupling to the GPS receiver, is required to store an abundant of data (or maps) in addition its own operation system, a plurality of expansion slots are to be prepared for receiving the different memory cards holding different information. Under this condition, the user can replace any suitable memory card at different environment in order to achieve the desired object.

The electronic devices are produced more and more compact as days go by. How to plan out the design for different electronic components within the limited space becomes an urgent task to be deal with. Presently, a SD (Secure Digital Flash Memory) card is used for storing the map data, and has a dimension of 24 mm×32 mm×2.1 mm. The width of the expansion slot for receiving the SD card should be greater than the thickness of the SD card. Under this condition, a relatively great difficult is encountered when designing a mobile phone of compact dimension.

A more compact NAND card has been proposed to replace the SD card, because the former has more storage capacity when compared to the latter. The manufacturers in the related field have invented a compact NAND card that can be soldered directly on the circuit board of the hand-held device. The dimension of the expansion slot can be reduced to half for seating such NAND card, thereby saving a great amount of room. Due to large storage capacity of the NAND card, the hand-held device does not need optional slots, which, in turn, results in lesser manufacturing cost.

Note that it is time consuming for burning the operation system of the SD or NAND card, or the map data in a burning apparatus. For instance, a burning device in a PC can burn only one piece of NAND card at one time. For the NAND card of 1G storage capacity, a time period of 20 minutes is required for burning data therein. Therefore, for mass production of the NAND cards, the process is time consuming and results in high manufacturing expense.

A chip burner has been invented in order to burn a plurality of flash NAND cards at the same time so as to avoid the occurrence of time-consuming and high manufacturing expense.

FIG. 1A shows a prior art chip burner and includes a circuit board 10, a flexible cable 12 and a transit plate 14. The circuit board 10 is capable of receiving a flash card 2. The flexible cable 12 has two opposite terminals interconnected to the circuit board 10 and the transit plate 14 respectively. The transit plate 14 can be inserted into the server 3 in order to burn the data within the serve 3 to the flash card 2.

As illustrated in FIG. 1B, the circuit board 10 further includes a socket 101 and a set of coupling pins 103. When the retainer 102 is pressed outward, the flash card 2 can be inserted into the socket 101. The retainer 102 retrieves to its initial position upon release of the pressing force so as to retain the flash card 2 securely within the socket 101. The circuit board 10 also has circuit paths for establishing electrical communication between the flash card 2 and the server 3 once the coupling pins 103 are inserted into the transit plate 14.

As best shown in FIG. 1C, the circuit board 10 can be formed with a plurality of sockets 101 for receiving a plurality of the flash cards respectively. For insertion, the respective socket 51 is pressed manually in order to repel the retainers 102 away from the socket 101 prior to inserting each flash card into a respective socket 101. Manually pressing the socket 101 is laborious and time consuming. The force exerted by the hand cannot always produce the same magnitude, thereby tending to ruin of the socket 101 and the retainers 102 or else the flash cards 2 are not retained securely within the sockets 101. Thus, the flash cards may wobble during the burning operation and can provide unstable burning efficiency.

SUMMARY OF THE INVENTION

One objective of the present invention is to provide a chip holding apparatus, in which, a holding block is implemented for simultaneously disengaging a plurality of retainers from several sockets formed of a circuit board so as to permit insertion of a plurality of chips into the sockets respectively.

A chip holding apparatus is provided according to the present invention and includes a holding block disposed above a circuit board that is formed with a plurality of sockets for holding chips respectively. Each of the sockets is formed with a retainer for securely holding the chip. The chip holding apparatus further includes a lift assembly coupled operably to the holding block. The holding block is formed with a plurality of openings. The lift assembly moves the holding block to a lower position, in which, the holding block presses and disengages the retainers from the sockets in order to permit insertion of the plurality of chips into the sockets via the openings in the holding block, and an upper position above the lower position, in which, the retainers retrieve to its normal condition, thereby retaining the chips securely within the sockets, respectively.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCRIPTIONS OF THE PREFERRED EMBODIMENTS

Figure 2:
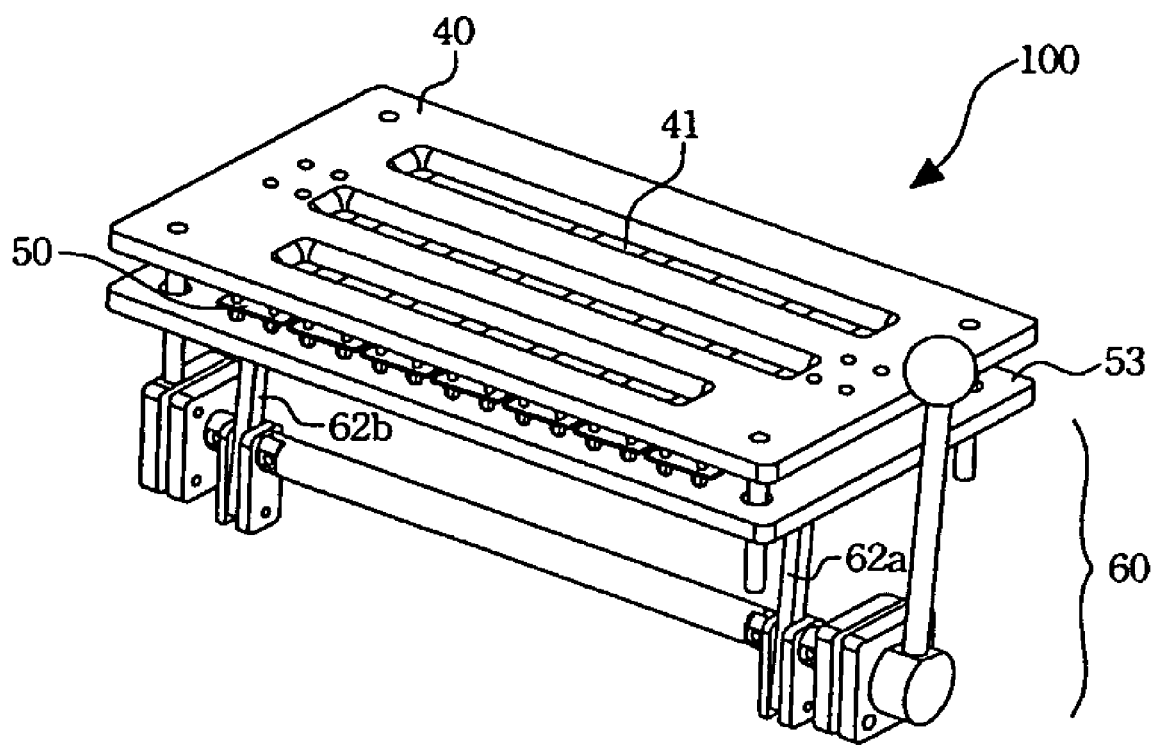
FIG. 2 is a perspective view of one embodiment of a chip holding apparatus according to the present invention.

Referring to FIG. 2, one embodiment of a chip holding device 100 of the present invention is shown and is employed within a burning device (not shown) for burning data into one chip or several chips. The present chip holding device 100 can simultaneously disengage retainers from sockets formed on a circuit board to permit insertion of a plurality of chips respectively into the sockets. The chips may consist of flash memory cards, such as NOR flash card, AND flash card, SD standard card, MS standard card, XD standard card, CF standard card, MMC standard card and SM standard card.

The chip holding apparatus 100 accordingly includes a holding block 40 and a lift assembly 60. The holding block 40 is disposed above the circuit board 50, and is formed with a plurality of openings 41. The circuit board 50 is formed with a plurality of sockets 51 (see FIG. 3). In this embodiment, the sockets 51 are mounted on a carrier plate 53. Alternatively, the sockets 51 can be mounted on the circuit board 50. The lift assembly 60 is disposed below the holding block 40, and includes left and right support rods 62a, 62b having upper ends coupled to the holding block 40. The lift assembly 60 is capable of moving the holding block 40 to a lower position, in which, the holding block 40 presses and disengages the retainers 52 (see FIG. 3) from the sockets 51 in order to permit insertion of the plurality of chips (not shown) into the sockets 51 via the openings 41 in the holding block 40, and an upper position above the lower position, in which, the retainers 52 retrieve to its normal condition, thereby retaining the chips (not shown) securely within the sockets 51 respectively.

Figure 3:
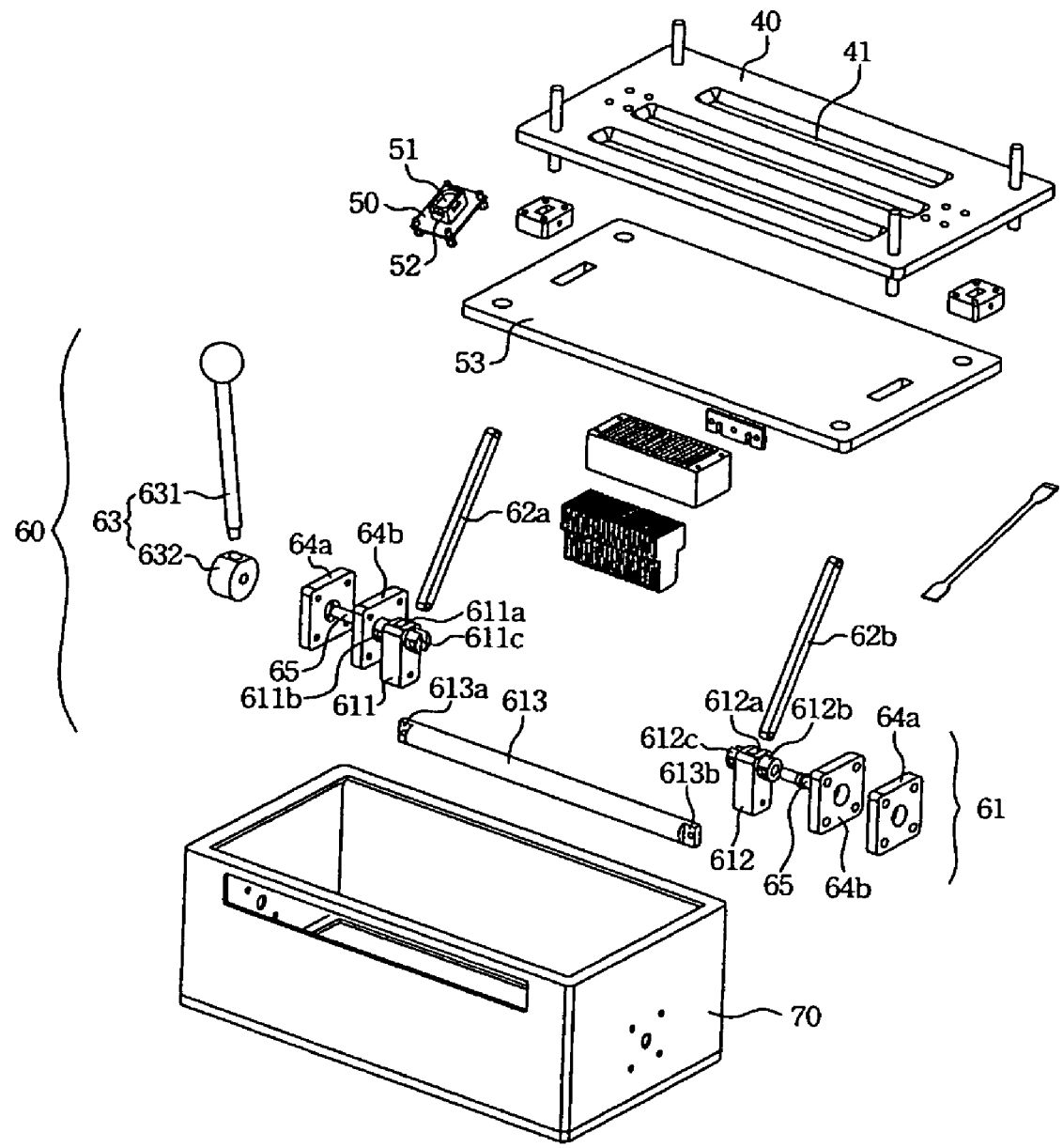
FIG. 3 is an exploded view of one embodiment of the chip holding apparatus of the present invention.

FIG. 3 illustrates an exploded view of the view of one embodiment of the chip holding apparatus 100 of the present invention. Each of the openings 41 is an elongated slot. When the holding block 40 is at the lower position, the elongated slot exposes a respective row of the sockets 51 on the circuit board due to outward movement of the retainer 52 from the respective socket 51. In the drawing, each of the elongated slots extends in a longitudinal length of the holding block 40. The extending direction of the elongated slot should not be restricted only in the longitudinal length, transverse, inclined to or perpendicular to the longitudinal length can also be designed if required. Since each row of the sockets 51 is aligned with the respective slot, the row of the socket 51 will be exposed to permit insertion of the chips respectively into the sockets 51 via the respective slot. Each of the sockets 51 has two opposite first walls defining a respective one of the retainers 52. The opposite first walls define a gap therebetween that is greater than a width of the elongated slot. Each of the sockets 51 further has two opposite second walls interconnected to the first walls respectively so as to form a square configuration. Under this condition, each of the first and second walls has a length greater than a width of the elongated slot such that when the holding block 40 is at the lower position, the first walls will be pressed outward away from a respective socket 51, thereby permitting insertion of the chip into the respective socket 51.

During assembly, the plurality of sockets 51 can firstly mounted on the circuit board 50, which is later attached to the carrier plate 53. Alternatively, the sockets 51 can be integrally formed on a single circuit board 50 in order to economize the material for constructing the carrier plate 53 and the space for accommodation of the carrier plate 53.

Referring again to FIG. 3, the lift assembly 60 further includes left and right rod-moving mechanisms 61 mounted respectively and operably to lower ends of the support rods 62a, 62b in such a manner that activation of the rod-moving mechanism 61 results in movement of the holding block 40 between the upper and lower positions.

The lift assembly 60 further includes a transmission shaft 613 coupled to the left and right support rods 62a, 62b via the left and right rod-moving mechanisms 61. Each of the left and right rod-moving mechanisms 61 includes a base seat 611, 612 formed with a recess 611a, 612b for receiving the lower end of the respective support rod 62a, 62b.

Each of the base seat 611, 612 has a bifurcated coupling portion 611c, 612c on an inner side thereof and a circular fastener element 611b, 612b on an outer side thereof. The transmission shaft 613 has two opposite fastening ends 613a, 613b extending respectively and fittingly into the bifurcated coupling portions 611c, 612c of the base seats 611, 612. Two screws are inserted through the holes in the bifurcated coupling portions 611c, 612c and the transmission shaft 613 in order to fasten the transmission shaft 613 securely to the left and right base seats 611, 612 such that rotation of the transmission shaft 613 simultaneously move the left and right base seats 611, 612 and the left and right support rods 62a, 62b, thereby moving the holding block 40 between the upper and lower positions.

The lift assembly 60 further includes left and right fixing units, each fixing unit is consist of inner and outer fixing plates 64a, 64b for disposing exterior to the respective base seat 611, 612, and a locking element 65 extending through the central holes in the inner and outer fixing plates 64a, 64b for engaging the circular fastener element 611b, 612b of the respective base seat 611, 612.

The lift assembly 60 further includes a propelling member 63 fastened securely to the rod-moving mechanism 61 in such a manner that turning of the propelling member 63 about an axis results in activation of the rod-moving mechanism 61. The propelling member 63 preferably includes an operating handle 631 and a circular securing seat 632. The securing seat 632 is formed with an upper hole for insertion of a lower end of the operating handle 631.

Figure 4A:
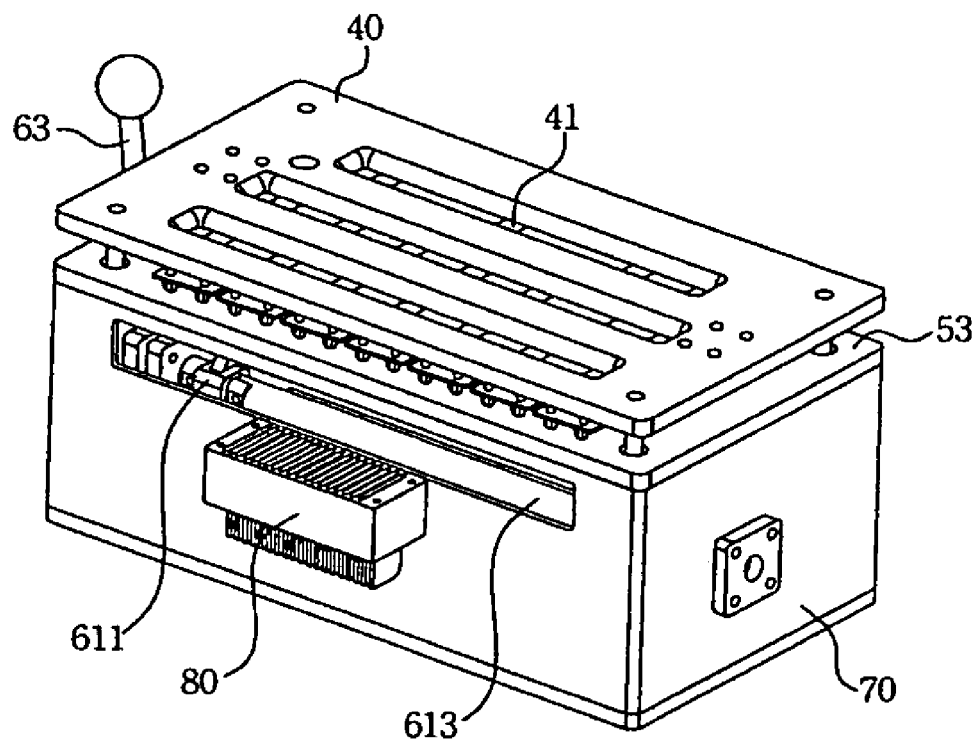
FIG. 4A is a perspective view of a modified chip holding apparatus of the present invention.

Referring to FIG. 3, one embodiment of the chip holding apparatus 100 of the present invention further includes a rectangular bottom box 70 having two opposite side walls. As best shown in FIG. 4A, the inner and outer fixing plates 64a, 64b of the left and right fixing units are fixed respectively to the side walls of the bottom box 70 via a plurality of screws such that the outer fixing plates 64a are exposed from the side walls of the box 70. Thus, after assembly, the left and right base seats 611, 612 are located interior to the side walls of the bottom box 70 holding the transmission shaft 613 therebetween while the inner and outer fixing plates 64a, 64b sandwich the respective side wall of the box 70 securely therebetween. The operating handle 631 is mounted rotatably on the outer fixing plate 64a of the left fixing unit via the circular securing seat 632 in such a manner that activation of the operating handle 631 simultaneously rotate the base seats 611, 612 and the transmission shaft 613, hence moving the support rods 62a, 62b. In other words, turning of the operating handle 631 about the axis of the transmission shaft 613 results in movement of the holding block 40 between the upper and lower positions. As to how the holding block 40 presses and removes the retainers 52 away from the sockets 51 is explained in the above paragraphs, a repetition thereof is omitted herein for the sake of brevity.

Figure 1:
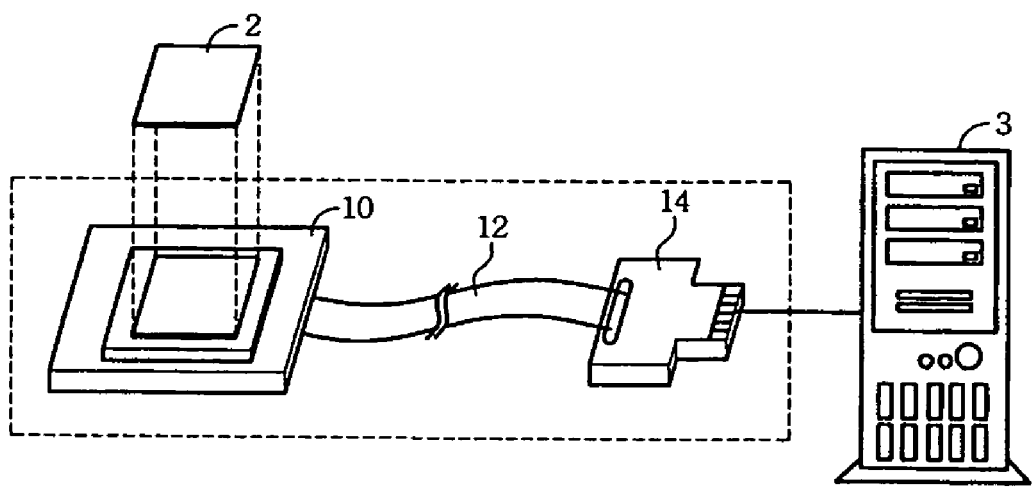
FIG. 1A illustrates a prior art burning device for burning flash memory cards.
FIG. 1B is an enlarged view of a circuit board employed in the prior art burning device.
FIG. 1C shows a topside of the prior art burning device, illustrating how flash memory cards are inserted into the sockets prior to burning data thereinto.
Figure 1:
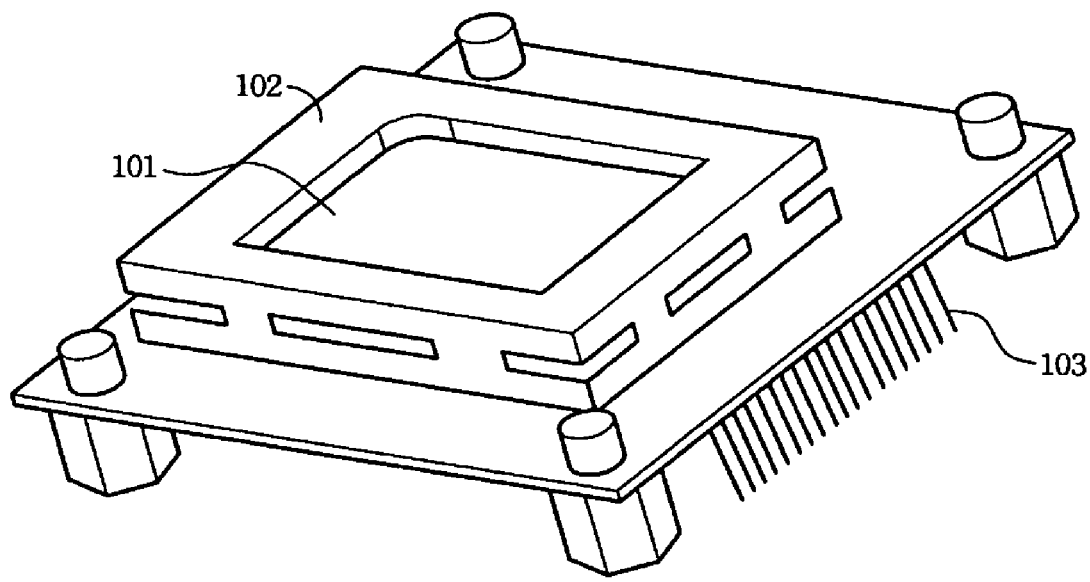
Figure 1:
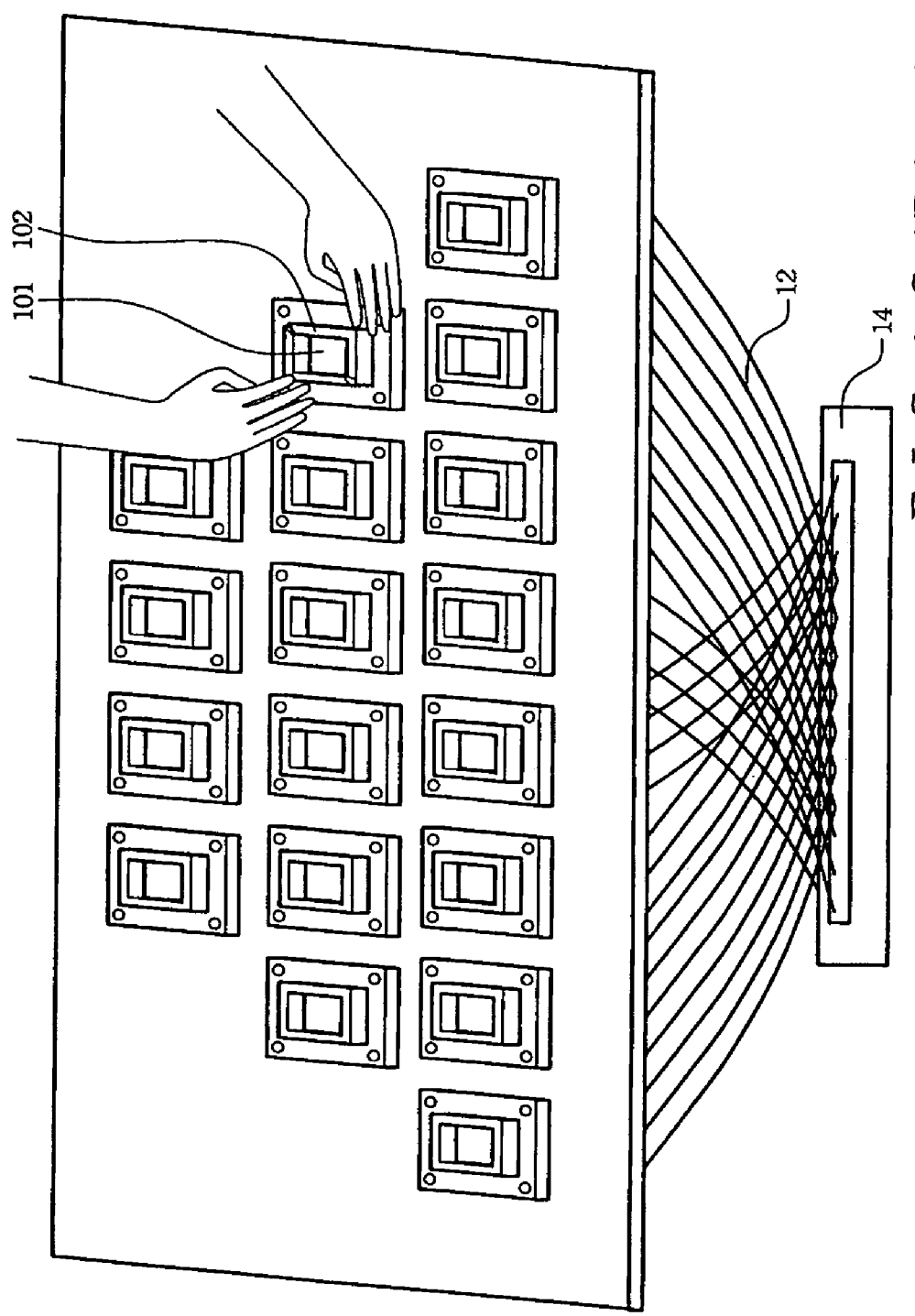
Figure 4B:
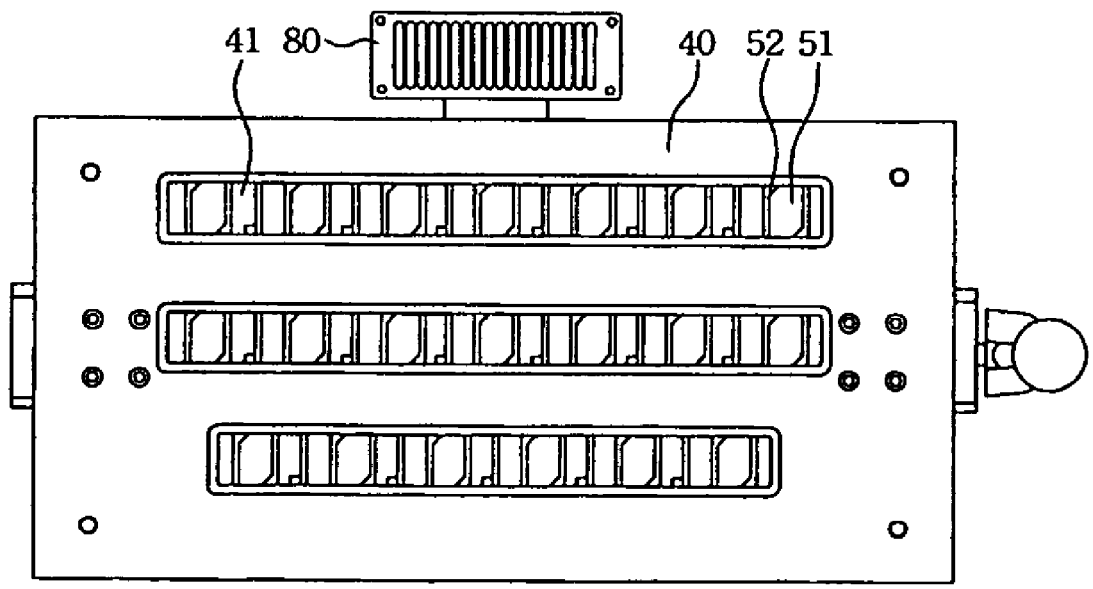
FIG. 4B is a top view of the modified chip holding apparatus of the present invention.

As illustrated FIG. 4B, one embodiment of the chip holding apparatus of the present invention further includes a pin-collector 80 that is disposed exterior to the bottom box 70 and that holds the coupling pins 103 (in electrical communication with the sockets 51). A flexible cable 12 (see FIG. 1A) can be used for coupling the pin collector 80 to the server 3 (see FIG. 1A) in order to burn the data from the server into the chips (not shown) held within the sockets 51. The data may consist of software, such as operation system, road maps, text documents, navigation photos and so forth. The burning or storing of data can be conducted to a single card or multiple cards. Since the retainers 52 are simultaneously removed from the sockets 51 by the holding block 40 when the holding block is moved to the lower position, no manual labor is wasted, which, in turn, enhances the burning efficiency of the flash cards.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A chip holding apparatus for simultaneously disengaging retainers from sockets formed on a circuit board to permit insertion of a plurality of chips respectively into the sockets, comprising:
   a holding block for disposing above the circuit board, and formed with a plurality of openings;
   a lift assembly coupled to said holding block for moving said holding block to a lower position, in which, said holding block presses and disengages the retainers from the sockets in order to permit insertion of the plurality of chips into the sockets via said openings in said holding block, and an upper position above said lower position, in which, the retainers retrieve to its normal condition, thereby retaining the chips securely within the sockets respectively.

2. The chip holding apparatus according to claim 1, wherein each of said openings is an elongated slot exposing a respective one of the sockets on the circuit plate due to outward movement of the retainer from the respective socket when said holding block is at said lower position.

3. The chip holding apparatus according to claim 2, wherein each of said elongated slots extends in a longitudinal length of said holding block.

4. The chip holding apparatus according to claim 2, wherein each of the sockets has two opposite first walls defining a respective one of the retainers, said opposite first walls defining a gap therebetween that is greater than a width of said elongated slot.

5. The chip holding apparatus according to claim 4, wherein each of the sockets further has two opposite second walls interconnected to the first walls respectively so as to form a square configuration.

6. The chip holding apparatus according to claim 5, wherein each of said first and second walls has a length greater than a width of said elongated slot.

7. The chip holding apparatus according to claim 1, wherein said a lift assembly includes at least one support rod having upper end supporting said holding block above the circuit board and a lower ends, and a rod-moving mechanism mounted operably to said lower end of said support rod in such a manner that activation of said rod-moving mechanism results in movement of said holding block between said upper and lower positions.

8. The chip holding apparatus according to claim 7, wherein said a lift assembly further includes a propelling member fastened securely to said rod-moving mechanism in such a manner that turning of said propelling member about an axis results in activation of said rod-moving mechanism.

9. The chip holding apparatus according to claim 8, wherein said propelling member includes an operating handle fastened securely to said rod-moving mechanism, said operating handle being turnable about said axis.

\* \* \* \* \*